United States Patent
Liu

(10) Patent No.: US 11,863,855 B2
(45) Date of Patent: Jan. 2, 2024

(54) TERMINAL DEVICE AND IMAGE CAPTURING METHOD

(71) Applicant: GUANGDONG OPPO MOBILE TELECOMMUNICATIONS CORP., LTD., Guangdong (CN)

(72) Inventor: Chang Liu, Guangdong (CN)

(73) Assignee: GUANGDONG OPPO MOBILE TELECOMMUNICATIONS CORP., LTD., Dongguan (CN)

(*) Notice: Subject to any disclaimer, the term of this patent is extended or adjusted under 35 U.S.C. 154(b) by 302 days.

(21) Appl. No.: 17/053,235

(22) PCT Filed: May 8, 2018

(86) PCT No.: PCT/CN2018/086017
§ 371 (c)(1),
(2) Date: Nov. 5, 2020

(87) PCT Pub. No.: WO2019/213839
PCT Pub. Date: Nov. 14, 2019

(65) Prior Publication Data
US 2021/0243343 A1 Aug. 5, 2021

(51) Int. Cl.
*G06F 3/041* (2006.01)
*H04N 23/57* (2023.01)
(Continued)

(52) U.S. Cl.
CPC ............ *H04N 23/57* (2023.01); *G06F 3/041* (2013.01); *G06V 40/16* (2022.01); *G09G 3/3208* (2013.01);
(Continued)

(58) Field of Classification Search
CPC .... H04N 5/2257; H04N 5/2353; H04N 5/335; G06F 3/041; G06V 40/16; G09G 3/3208;
(Continued)

(56) References Cited

U.S. PATENT DOCUMENTS

| 4,928,301 A | 5/1990 | Smoot |
| 9,013,613 B2 | 4/2015 | Ogita et al. |

(Continued)

FOREIGN PATENT DOCUMENTS

| CN | 1708979 A | 12/2005 |
| CN | 102237015 A | 11/2011 |

(Continued)

OTHER PUBLICATIONS

Chinese Office Action with English Translation for CN Application 201880093265.7 dated Aug. 18, 2021. (11 pages).
(Continued)

*Primary Examiner* — Thuy N Pardo
(74) *Attorney, Agent, or Firm* — Young Basile Hanlon & MacFarlane, P.C.

(57) ABSTRACT

In an embodiment, a terminal device includes a display unit having a display screen, and a light sensing unit located below the display unit and configured to sense incident light transmitted through the display screen. The display unit includes a transparent electrode, an opaque electrode, and an organic layer sandwiched between the two electrodes. The organic layer spontaneously emits light when a voltage difference is applied between the two electrodes. The second electrode has a semi-transparent area disposed corresponding to the light sensing unit and a remaining area which is an area of the second electrode except for the semi-transparent area. Also, an image capturing method is provided.

19 Claims, 7 Drawing Sheets

(51) Int. Cl.
*G09G 3/3208* (2016.01)
*G06V 40/16* (2022.01)
*H04N 23/73* (2023.01)
*H10K 59/40* (2023.01)
*H10K 59/60* (2023.01)

(52) U.S. Cl.
CPC ............. *H04N 23/73* (2023.01); *H10K 59/40* (2023.02); *H10K 59/60* (2023.02); *G09G 2310/08* (2013.01); *G09G 2360/14* (2013.01)

(58) Field of Classification Search
CPC .. G09G 2310/08; G09G 2360/14; G09G 3/32; H01L 27/3227; H01L 27/323; H01L 51/5203; H01L 27/3234
USPC .................... 345/173, 174, 87, 175, 17, 207
See application file for complete search history.

(56) References Cited

U.S. PATENT DOCUMENTS

| | | | |
|---|---|---|---|
| 9,736,383 | B2 | 8/2017 | Evans, V et al. |
| 9,823,694 | B2 | 11/2017 | Evans, V et al. |
| 9,864,400 | B2 | 1/2018 | Evans, V et al. |
| 9,870,024 | B2 | 1/2018 | Evans, V et al. |
| 2002/0070278 | A1 | 6/2002 | Hung et al. |
| 2007/0139345 | A1 | 6/2007 | Shie et al. |
| 2008/0025605 | A1 | 1/2008 | Suino |
| 2008/0106629 | A1 | 5/2008 | Kurtz et al. |
| 2012/0154261 | A1* | 6/2012 | Fujikawa ........... G02F 1/136227 345/87 |
| 2012/0228647 | A1* | 9/2012 | Yamamoto .......... H01L 51/5275 438/46 |
| 2012/0267611 | A1 | 10/2012 | Chung et al. |
| 2012/0274727 | A1 | 11/2012 | Robinson et al. |
| 2013/0009888 | A1 | 1/2013 | Park et al. |
| 2013/0093988 | A1* | 4/2013 | Suzuki .............. G02F 1/134363 349/143 |
| 2016/0195988 | A1* | 7/2016 | Fu ........................ G06F 3/04166 345/174 |
| 2016/0378260 | A1* | 12/2016 | Weaver ................ G06F 3/0445 345/174 |
| 2017/0263652 | A1* | 9/2017 | Kimura .............. G06F 3/04166 |
| 2018/0145114 | A1* | 5/2018 | Sim ........................ G06F 3/044 |
| 2018/0329558 | A1* | 11/2018 | Park .................... G02F 1/13338 |

FOREIGN PATENT DOCUMENTS

| | | |
|---|---|---|
| CN | 102411878 A | 4/2012 |
| CN | 106101502 A | 11/2016 |
| CN | 106921818 A | 7/2017 |
| CN | 107071244 A | 8/2017 |
| CN | 107407988 A | 11/2017 |
| GB | 2035749 A | 6/1980 |
| WO | 2004008736 A1 | 1/2004 |
| WO | 2018012719 A1 | 1/2018 |

OTHER PUBLICATIONS

Extended European Search Report for EP Application 18918160.5 dated Apr. 23, 2021. (7 pages).
International Search Report for PCT/CN2018/086017 dated Jan. 30, 2019.
Chinese Notification to Grant Patent Rights For Invention with English Translation for CN Application 201880093265.7 dated Mar. 22, 2022. (13 pages).
Chinese Office Action with English Translation for CN Application 202210633843.X dated Jul. 28, 2023. (29 pages).

* cited by examiner

TERMINAL DEVICE AND IMAGE CAPTURING METHOD

CROSS-REFERENCE TO RELATED APPLICATION(S)

This application is a 371 application of International Application No. PCT/CN2018/086017, filed on May 8, 2018, the entire disclosure of which is hereby incorporated by reference.

TECHNICAL FIELD

The present disclosure relates to terminal device technologies, and more particularly, to a terminal device and an image capturing method.

BACKGROUND

Front-facing camera-equipped terminal devices, such as smartphones and tablets, are being widely used. Front-facing cameras are placed on a same side of display screens of terminal devices, that is, the front side of the terminal devices. The front-facing camera occupies a top or bottom part of the front side accompanied with other components, such as a speaker, a light sensor, and a light emitting diode (LED) indicator. The display screen does not occupy the full front side of the terminal devices. Accordingly, the size of the display screen cannot be efficiently maximized.

SUMMARY

In a first aspect of the present disclosure, a terminal device includes a display unit having a display screen and configured to display images on the display screen; and a light sensing unit located below the display unit and configured to sense incident light transmitted through the display screen, wherein the display unit includes a display panel and the display panel includes a first electrode which is a transparent electrode; a second electrode which is an opaque electrode; and an organic layer sandwiched between the first electrode and the second electrode, wherein the organic layer spontaneously emits light when a voltage difference is applied between the first electrode and the second electrode, wherein the second electrode has a semi-transparent area disposed corresponding to the light sensing unit and a remaining area which is an area of the second electrode except for the semi-transparent area.

In a second aspect of the present disclosure, a terminal device includes a display unit having a display screen and configured to display images on the display screen; a light sensing unit located below the display unit and configured to sense incident light transmitted through the display screen; and a timing control unit connecting to the display unit and the light sensing unit and configured to control a timing sequence in operating the light sensing unit and the display unit.

In a third aspect of the present disclosure, an image capturing method is applied to a terminal device including a display unit having a display screen, and a front-facing camera located below the display unit and configured to sense incident light transmitted through the display screen. The method includes using the display unit to display images; determining a vertical blanking interval (VBI) of a frame of at least one image displayed by the display unit; and controlling a shutter of the front-facing camera to be opened for a predetermined period of time based on the VBI of the frame of the at least one image displayed by the display unit to capture a scene in front of the terminal device as a captured image.

BRIEF DESCRIPTION OF DRAWINGS

In order to more clearly illustrate the embodiments of the present disclosure or related art, the following figures will be described in the embodiments are briefly introduced. It is obvious that the drawings are merely some embodiments of the present disclosure, a person having ordinary skill in this field can obtain other figures according to these figures without paying the premise.

DETAILED DESCRIPTION

Embodiments of the present disclosure are described in detail with the technical matters, structural features, achieved objects, and effects with reference to the accompanying drawings as follows. Specifically, the terminologies in the embodiments of the present disclosure are merely for describing the purpose of the certain embodiment, but not to limit the disclosure.

Figure 1:
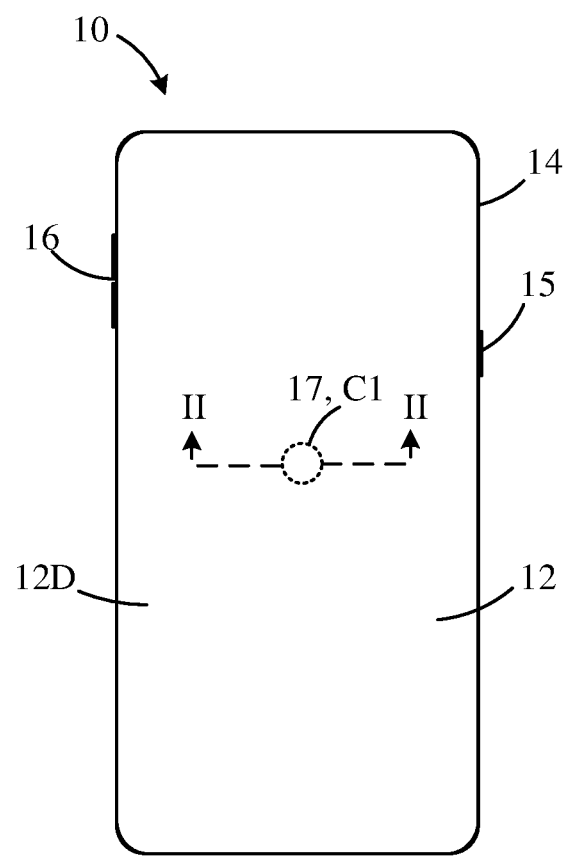
FIG. 1 is a front view of a terminal device according to an embodiment of the present disclosure.

FIG. 1 is a front view of a terminal device 10 according to an embodiment of the present disclosure. As shown in FIG. 1, the terminal device 10 may be carried by a mobile phone terminal. The terminal device 10 includes a display unit 12 for displaying images, and an outer case 14 receiving the display unit 12. The terminal device 10 may also include functional buttons such as a power button 15 and a volume down/up button 16 protruded from the outer case 14 and located at lateral sides (e.g., left and right sides) of the terminal device 10. The display unit 12 has a display screen 12D exposed as an external surface of the terminal device 10 at a front side opposite to a rear side of the terminal device 10.

The terminal device 10 further includes a light sensing unit 17. The light sensing unit 17 is located below the display unit 12 and provided at a rear side of the display unit 12, particularly located between the display unit 12 and the outer case 14. The light sensing unit 17 is configured to sense incident light rays transmitted through the display screen 12D of the display unit 12. The light sensing unit 17 can be located at any suitable position of the display screen 12D, for example, located at a top left corner, a top right corner, a bottom left corner, or a bottom right corner of the display screen 12D or arranged along with any of four edges of the display screen 12D. In an embodiment, the light sensing unit 17 is located at a center of the display screen 12D, as shown in FIG. 1.

The light sensing unit 17 may be carried by a front-facing camera C1 used to capture images of human bodies, objects, and/or scenes in front of the terminal device 10. In an embodiment, the light sensing unit 17 is a luminance sensor provided for correcting the luminance of the display screen 12D. In an embodiment, the light sensing unit 17 is a proximity sensor provided for detecting the approach of a user's face to the display screen 12D. In an embodiment, the light sensing unit 17 may have integrated functions including at least two of image capturing, luminance sensing, and proximity sensing.

Regardless of what state the light sensing unit 17 is (i.e., activated or deactivated), the light sensing unit 17 is almost invisible to a user in front of the terminal device 10. Further, the deployment of the light sensing unit 17 will almost certainly not affect the displaying of images on the display screen 12D. The display unit 12 can still provide an excellent viewing experience to users.

The light sensing unit 17 is located below the display unit 12. That is, the light sensing unit 17 is integrated into the terminal device 10 without a need to occupy an area on the front surface of the terminal device 10. Accordingly, display screen area can increase and display screen-to-body ratio is maximized. A true full display is realized and thus immersive viewing experience is provided to users.

The terminal device 10 can be realized by a mobile terminal such as a mobile phone, smartphone, personal digital assistants (PDA), tablet, and video gaming device, a portable terminal such as a laptop and notebook, or a relatively large-sized device such as a computer display and television, or any other type of device having the light sensing unit hided below or inside a display body.

Figure 2A:
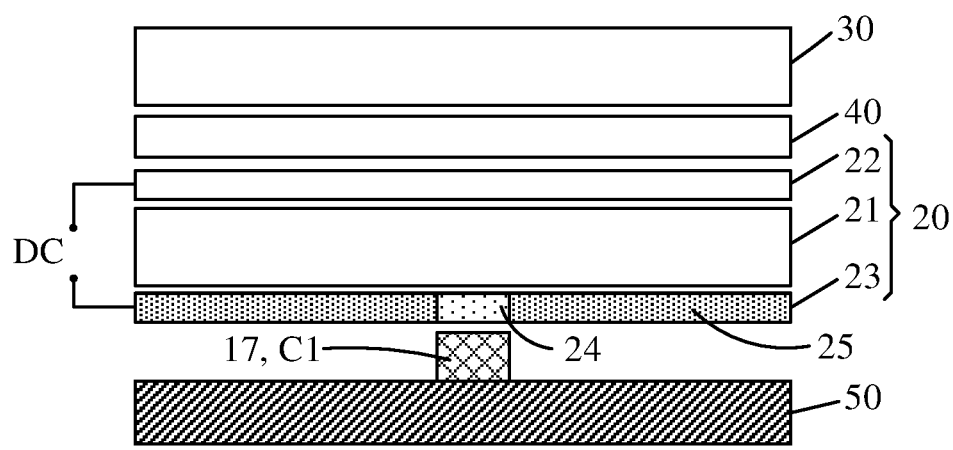
FIG. 2A is a sectional view of the terminal device taken along II-II of FIG. 1 in an example.
Figure 2B:
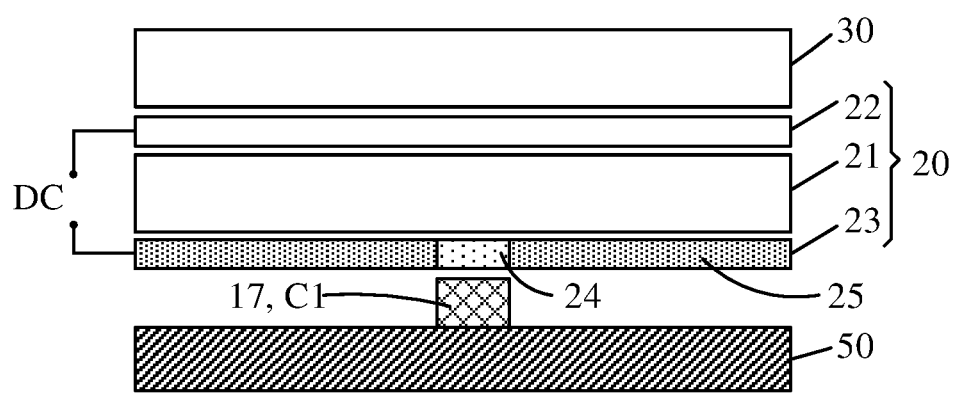
FIG. 2B is a sectional view of the terminal device taken along II-II of FIG. 1 in another example.

FIGS. 2A and 2B are sectional views of the terminal device 10 taken along II-II of FIG. 1. The display unit 12 includes a display panel 20. In an embodiment, the display panel 20 is an organic light emitting diode (OLED) display panel. The display panel 20 includes an organic layer 21, a first electrode 22, and a second electrode 23. The organic layer 21 is sandwiched between the first electrode 22 and the second electrode 23. The organic layer 21 is divided into a red layer corresponding to red pixels, a green layer corresponding to green pixels, and a blue layer corresponding to blue pixels. When a voltage difference is applied between the first electrode 22 and the second electrode 23, the organic layer 21 spontaneously emits light. Particularly, the red layer emits red light, the green layer emits green light, and the blue layer emits blue light for color display. Self-illumination is achieved by the display panel 20.

The first electrode 22 is a transparent electrode made of, for example, indium tin oxide (ITO). The second electrode 23 is a metal layer formed on the organic layer 21 by deposition or coating. The second electrode 23 is an opaque electrode. The light emitted from the organic layer 21 may directly go through the first electrode 22 and emit from an external side of the first electrode 22 or may be reflected by the second electrode 23 toward a direction from the second electrode 23 to the first electrode 22. The display panel 20 belongs to a single-sided light emission type.

The display unit 12 includes a cover plate 30 made of plastic or glass. The cover plate 30 is the outermost layer of the display unit 12. The light emitted from the organic layer 21 of the display panel 20 exits the display unit 12 from an external side of the cover plate 30 to an environment of the terminal device 10 and is viewed by a user in front of the terminal device 10.

For touch control applications, the display unit 12 include a touch control electrode layer 40 interposed between the cover plate 30 and the display panel 20, as shown in FIG. 2A. The touch control electrode layer 40 is used to detect touch operations and generate sensing signals correspondingly for determining coordinate(s) of one or more than one touched points or a gesture formed by the touched points. The deployment of the touch control electrode layer 40 is optional and may be not required for the applications without touch control function, as depicted in FIG. 2B. That is, the terminal device 10 is also applicable to a display without the touch control function.

A first end of the light sensing unit 17 is mounted on a printed circuit board 50. A second end opposite to the first end of the light sensing unit 17 faces the display screen 12D for receiving the light transmitted through the display unit 12 for light sensing or image capturing. Electronic components for operating the light sensing unit 17, the display panel 20, and the touch control electrode layer 40 may be mounted on the printed circuit board 50.

The second electrode 23 of the display panel 20 has a semi-transparent area 24 disposed corresponding to the position of the light sensing unit 17. A remaining area 25 on the second electrode 23 is an area except for the semi-transparent area 24. In an embodiment, the semi-transparent area 24 and the remaining area 25 (i.e., the other areas on the second electrode 23 except for the semi-transparent area 24) of the second electrode 23 are distributed with a same material of metal particles. Concentration of the metal particles in the semi-transparent area 24 is less than the concentration of the metal particles in the remaining area 25. In an embodiment, the semi-transparent area 24 and the remaining area 25 (i.e., the other areas on the second electrode 23 except for the semi-transparent area 24) of the second electrode 23 are distributed with different materials of metal particles. Similarly, the concentration of the metal particles in the semi-transparent area 24 is less than the concentration of the metal particles in the remaining area 25. The semi-transparent area 24 and the remaining area 25 are parts of the second electrode 23 and belong to a same layer.

In an embodiment, the semi-transparent area 24 and the remaining area 25 are formed by coating one or more than one metal materials on an acrylic or polycarbonate sheet with different concentration and the sheet is attached to the organic layer 21. In an embodiment, the metal material(s) may also be directly coated on the organic layer 21. In an embodiment, deposition is utilized to form the semi-transparent area 24 and the remaining area 25. In an embodiment, metal particles are sputtered to a first area on a substrate with a first concentration value and to a second area on the substrate with a second concentration value to form the semi-transparent area 24 corresponding to the first area and the remaining area 25 corresponding to the second area, where the first concentration value is less than the second concentration value.

Figure 3:
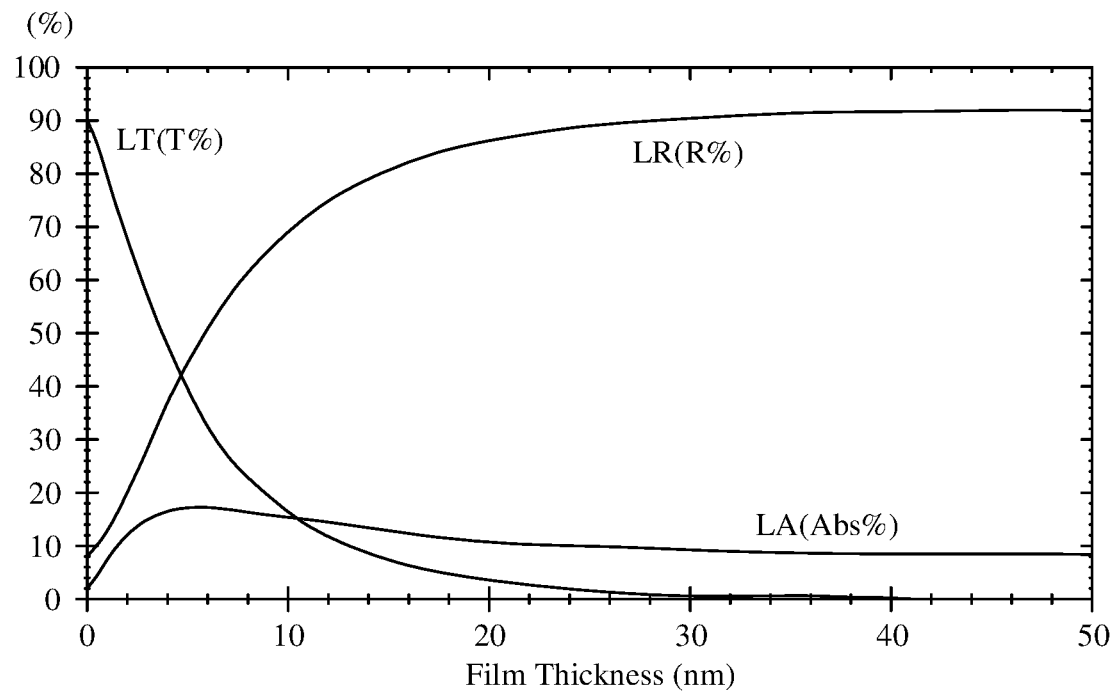
FIG. 3 is a diagram illustrating optical properties of a semi-transparent area shown in FIGS. 2A and 2B.

The light transmitted through the display screen 12D is substantially totally reflected by the remaining area 25 of the second electrode 23. The metal particles of the semi-transparent area 24 can realize similar effect as a one-way mirror for limited light transmission control. The semi-transparent area 24 is implemented by technology similar as a one-way mirror metal layer. The semi-transparent area 24 will partially reflect and partially transmit the light going toward the light sensing unit 17. An example of optical properties of the semi-transparent area 24 formed using a coating film material—aluminum is shown in FIG. 3, where a curve LR indicates reflectance, a curve LT indicates transmittance, a curve LA indicates absorption, a horizontal axis of this chart is a thickness of the coated film, and a vertical axis of this chart is percentages of the reflectance, the transmittance, and the absorption. The optical properties of the semi-transparent area 24 can be tuned by changing the thickness of the coated aluminum film.

Figure 4:
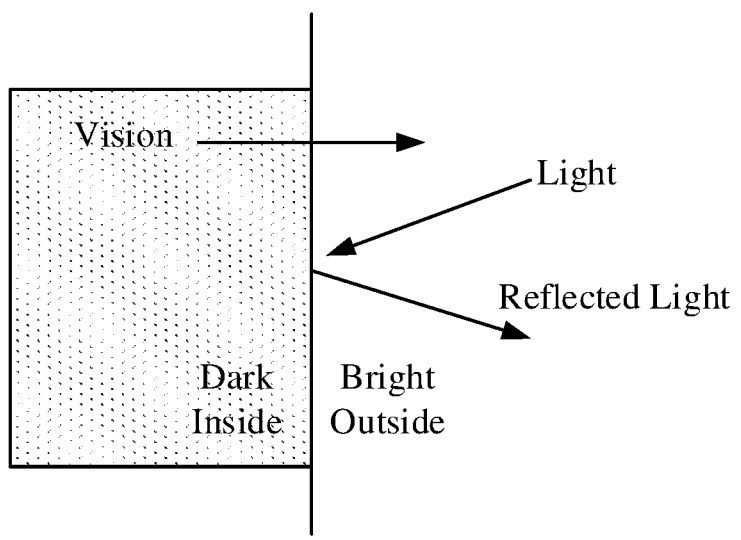
FIG. 4 is a diagram illustrating a vision from a bright side to a dark side.

For the coated aluminum film, light always passes equally in both directions. However, when one side of the film is bright and the other side of the film is dark, the dark side becomes difficult to see from the bright side because much more reflection is occurred at the bright side, as depicted in FIG. 4. The light sensing unit 17 is placed inside the terminal device 10 so the light sensing unit 17 is at the dark side. A user in front of the terminal device 10 is in an environment that is almost certainly brighter than the inside of the terminal device 10 so the user is at the bright side. Most of the light from the user's environment is reflected by the semi-transparent area 24 so the light sensing unit 17 is almost invisible to the user. Accordingly, the deployment of the light sensing unit 17 does not affect user experience in viewing the images displayed on the display screen 12D. Further, some of the light from the user's environment can still penetrate the semi-transparent area 24 and reach the light sensing unit 17. Accordingly, the light sensing unit 17 can detect luminance changes or capture images.

As described above, the concentration of the metal particles in the semi-transparent area 24 is less than the concentration of the metal particles in the remaining area 25. An electrical field corresponding to the semi-transparent area 24 may be much weaker than the remaining area 25. Image content displayed corresponding to the semi-transparent area 24 may be abnormal due to the setting of metal particle concentration. To solve this problem, the thickness of the coated metal film or the concentration of the metal particles in the semi-transparent area 24 may be compromised with the light intensity sensed by the light sensing unit 17. That is, for example, the thickness of the coated metal film forming the semi-transparent area 24 may be set thick enough so as not to affect the image content displayed in this area in sacrificing the light intensity sensed by the light sensing unit 17 for a little bit. In an embodiment, an average voltage difference applied between the semi-transparent area 24 and the first electrode 22 is substantially as the same as the average voltage difference applied between the remaining area 25 and the first electrode 22, particularly in the case that the electrical fields generated corresponding to the semi-transparent area 24 and the remaining area 25 are not significantly different in magnitude, for the reason that the thickness of the semi-transparent area 24 are set relatively thick or, the concentration of the metal particles in the semi-transparent area 24 is set relatively large (but still less than the concentration of the metal particles in the remaining area 25), as described above. In an embodiment, this can also be solved by increasing an average voltage difference applied between the semi-transparent area 24 and the first electrode 22. The average voltage difference applied between the semi-transparent area 24 and the first electrode 22 is greater than the average voltage difference applied between the remaining area 25 and the first electrode 22. That is, in average, the electrical field distribution is substantially the same in the semi-transparent area 24 and the remaining area 25.

Figure 5A:
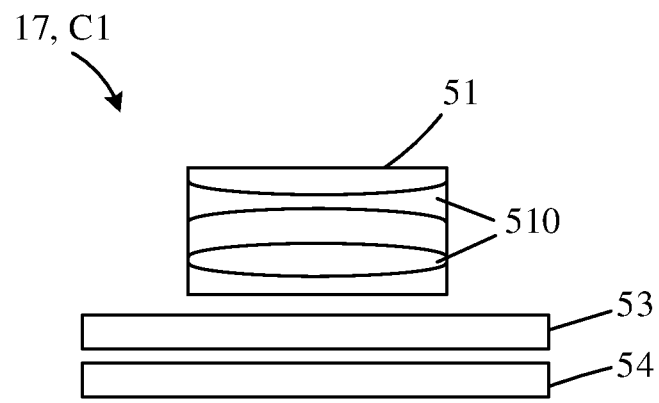
FIG. 5A is a diagram illustrating a light sensing unit according to an embodiment of the present disclosure.
Figure 5B:
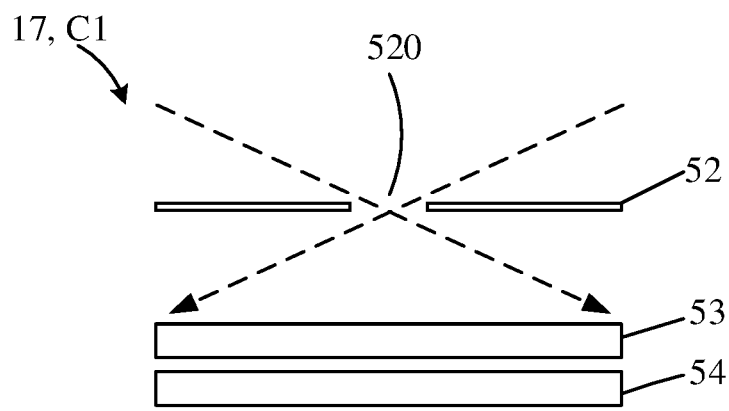
FIG. 5B is a diagram illustrating a light sensing unit according to another embodiment of the present disclosure.

As shown in FIG. 5A, the light sensing unit 17 includes a lens assembly 51 including one or more than one lenses 510, a luminance color filer 53, and an image sensor 54. The luminance color filter 53 is disposed between the lens assembly 51 and the image sensor 54. The image sensor 54 can be a charge coupled device (CCD) image sensor or a complementary metal oxide semiconductor (CMOS) image sensor. The light transmitted through the display screen 12D is reflected and/or refracted by the lens or lenses 510 of the lens assembly 51, filtered by the luminance color filter 53, and imaged on the image sensor 54. Instead of using the lens assembly 51 shown in FIG. 5A, a pin-hole imaging technique can be used to capture images. As shown in FIG. 5B, the light sensing unit 17 includes a pin-hole plate 52 including one or more than one pin holes 520. The use of pin hole(s) can form a real image on the image sensor 54. In an embodiment, the light sensing unit 17 can use one or more than one lenses 510 and one or more than one pin holes 520 to guide light paths.

Figure 6:
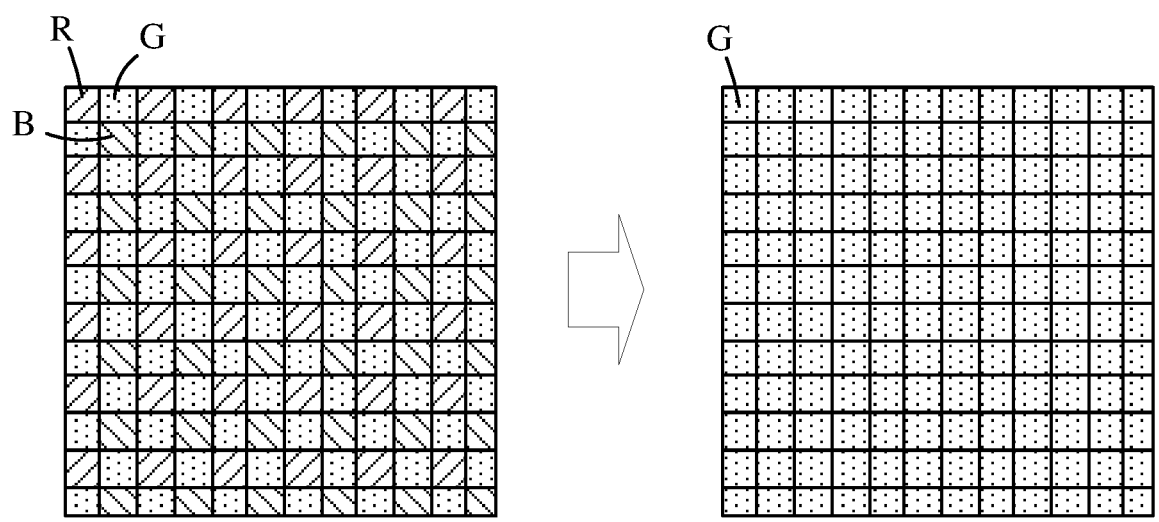
FIG. 6 is a diagram illustrating a beneficial effect using a luminance color filter.

Instead of using a RGB color filter, the luminance color filter 53 is used to maximize resolution in small size for some applications such as face unlocking. As depicted in FIG. 6, the RGB color filter includes red (R), green (G), and blue (B) color filter units. Light passes through each of the R, G, and B color filter units and is recorded as red, green, and blue pixels by the image sensor 54. An image dot of an image generated by the image sensor 54 includes at least a red pixel, a green pixel, and a blue pixel. In face-unlock applications, color information of a user's face is less important in recognizing the face. Luminance information of the face image is sufficient for face recognition. Accordingly, the luminance color filter 53 including mono-color filter units (e.g., green color shown in FIG. 6) is used in face unlocking. The luminance color filter 53 can increase resolution of the face image captured by the image sensor 54, and thus increase the chances of success in face unlocking.

When using the light sensing unit 17 to capture an image, the captured image may be affected by the luminance of displayed images on the display screen 12D because the light from the display screen 12D may be received, more or less, by the light sensing unit 17. To solve this problem, in an embodiment, the display screen 12D is turned off when the light sensing unit 17 operates to capture the image. After the light sensing unit 17 stops capturing the image, the display screen 12D is turned on to display images.

Figure 7:
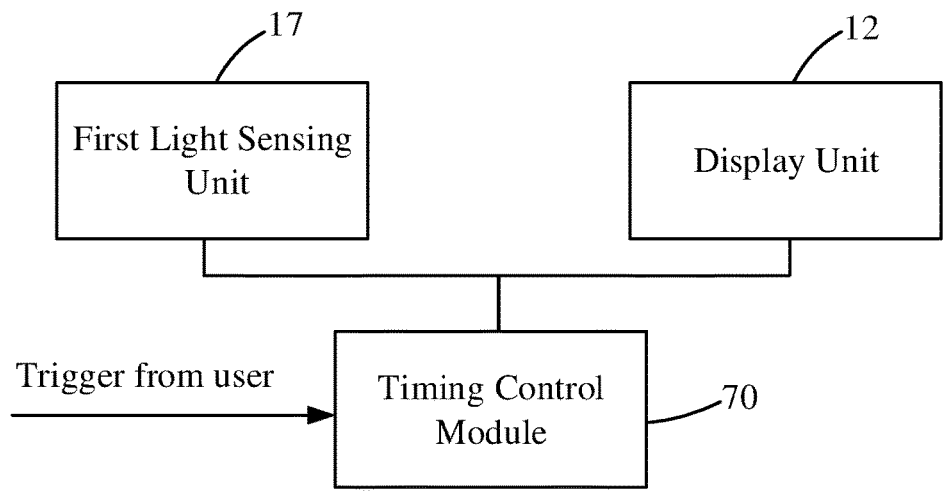
FIG. 7 is a diagram illustrating relations between a timing control mode, a light sensing unit, and a display unit of a terminal device.

Referring to FIG. 7, the terminal device further includes a timing control unit 70 connecting to the light sensing unit 17 and a display unit 12. The timing control unit 70 may be a hardware component deployed in the terminal device 10, a firmware, or an instruction set or program codes executable by a processor of the terminal device 10. In an example, the timing control unit 70 is a background process running on an operating system, such as ANDROID operating system and IOS operating system, of the terminal device 10. The timing control unit 70 is configured to control a timing sequence in operating the light sensing unit 17 and the display unit 12. After an image capturing request is received (i.e., trigger from user), the timing control unit 70 asks the display unit 12 to turn off the display screen 12D and controls the light sensing unit 17 to sense light intensity or capture one or more than one images while the display screen 12D is turned off. After the light sensing unit 17 completes in light sensing or image capturing, the timing control unit 70 controls the display unit 12 to resume displaying images. The off time of the display screen 12D is longer enough for the light sensing unit 17 to sense the light intensity or capture the image(s). The off time of the display screen 12D can be adjusted for different application scenarios. In an example, the off time is 100 ms or longer.

Figure 8A:
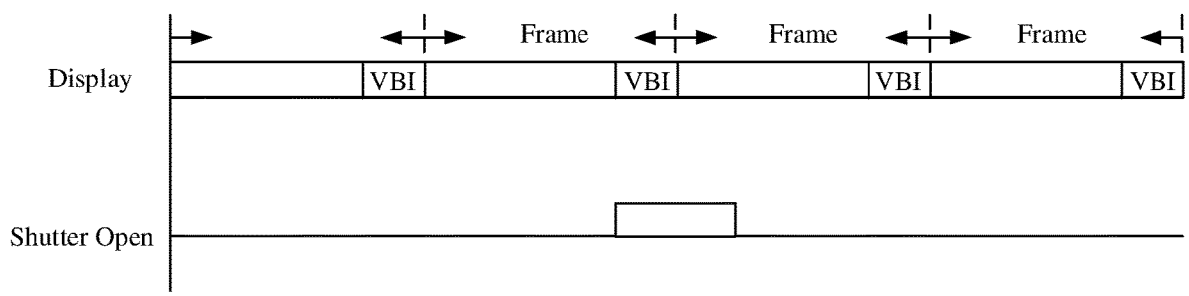
FIG. 8A is a diagram illustrating an example of a timing sequence of displayed images and a shutter of a light sensing unit.

In an embodiment, a shutter of the light sensing unit 17 may be opened for a predetermined period of time based on a vertical blanking interval (VBI) of a frame of images displayed by the display unit 12. As shown in FIG. 8A, the time to open the shutter of the light sensing unit 17 is based on the VBI of an image frame displayed on the display screen 12D. During the VBI, there is almost no display content shown on the display screen 12D, that is, the display screen 12D is almost dark during this period. The shutter is opened during this period so as to prevent the luminance of displayed images on the display screen 12D from affecting the light intensity sensing or the image capturing by using the light sensing unit 17.

The open duration of the shutter may be greater than the VBI of an image frame as depicted in FIG. 8A. That is, each sensing or capturing of the light sensing unit 17 may still be affected by the luminance of the display screen 12D at least for a part of the open duration of the shutter not overlapping with the VBI. However, this can be easily corrected by removing the signal corresponding to the part of the open duration of the shutter not overlapping with the VBI, or by determining an appropriate open duration of the shutter that is not significantly affected by the luminance of the display screen 12D, or by image processing performed on the captured image by the light sensing unit 17, or by any other suitable approaches. This approach facilitates the correction on the captured image.

The open duration of the shutter overlaps with the VBI of the image frame displayed by the display unit 12. The open duration of the shutter may start at a start of the VBI. The open duration of the shutter may end at an end of the VBI. Alternatively, a middle of the open duration of the shutter aligns with a middle of the VBI. The start, the end, or any given point of the open duration of the shutter is based on the VBI.

Figure 8B:
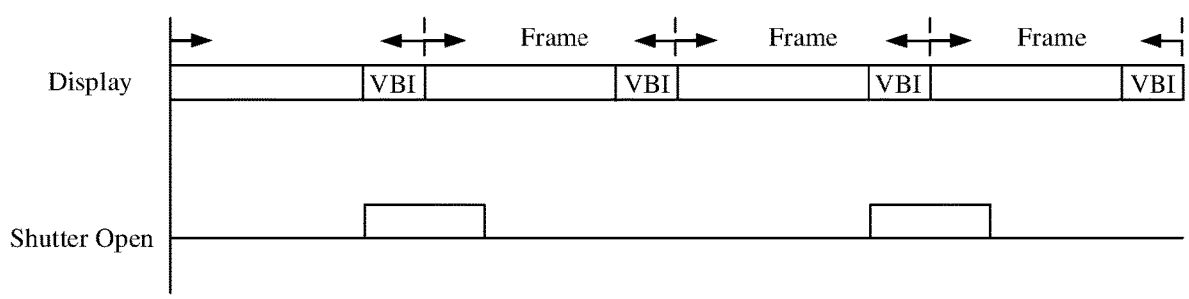
FIG. 8B is a diagram illustrating another example of a timing sequence of displayed images and a shutter of a light sensing unit.

In an embodiment, referring to FIG. 8B, the shutter of the light sensing unit 17 may be opened for more than one time at a predetermined time interval based on the VBIs of image frames displayed by the display unit 12. The light intensity or the captured content is accumulated to get a desired result. For example, the light sensing unit 17 takes multiple shots, and get a still image by accumulating or processing all of the captured content. In an embodiment, the shutter of the light sensing unit 17 is opened at a predetermined time interval based on the VBIs to capture a video.

Referring to FIGS. 7 and 8A, after an image capturing request is received (i.e., trigger from user), the timing control unit 70 controls the shutter of the light sensing unit 17 to be opened for a predetermined period of time based on the VBI of the image frame displayed by the display unit 12. In addition, referring to FIGS. 7 and 8B, based on instructions provided by the timing control unit 70, the shutter of the light sensing unit 17 may be opened for more than one time at a predetermined time interval based on the VBIs.

There is no need to turn off the display screen 12D while the light sensing or image capturing performed by the light sensing unit 17.

The afore-described approach allows the light sensing unit 17 to sense the light intensity or capture one or more images while the display screen 12D is on. That is, the display screen 12D does not need to be turned off manually or automatically in using the light sensing unit 17 to sense the light intensity or capture the image(s). Accordingly, the user is not interrupted in viewing the content displayed on the display screen 12D when using the function of the light sensing unit 17, and thus user viewing experience is improved.

Figure 9:
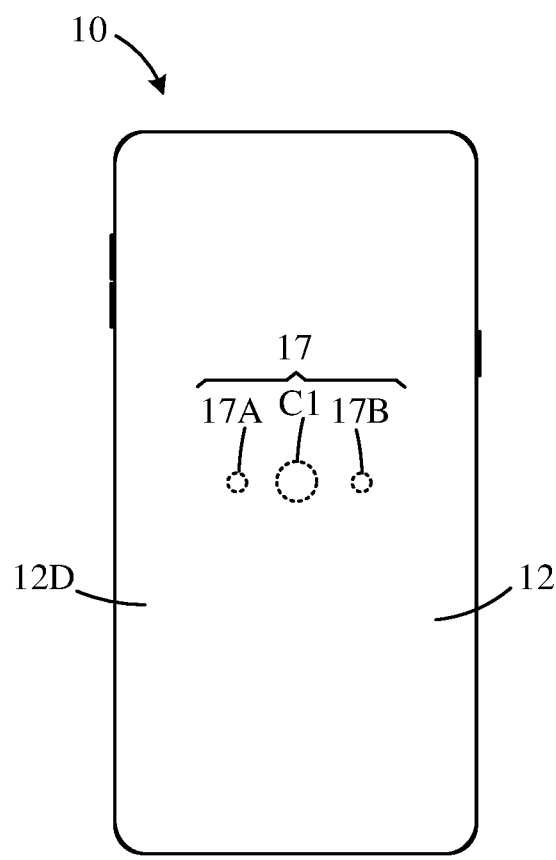
FIG. 9 is a front view of a terminal device according to an embodiment of the present disclosure.

Referring to FIG. 9, the light sensing unit 17 may include the front-facing camera C1, a luminance sensor 17A, and a proximity sensor 17B that are disposed below the display screen 12D and the display unit 12. The front-facing camera C1 is provided for image capturing. The luminance sensor 17A is provided for correcting the luminance of the display screen 12D. The proximity sensor 17B is provided for detecting the approach of a user's face to the display screen 12D. Any one of or both of the luminance sensor 17A and the proximity sensor 17B are provided below the display unit 12. In an embodiment, one camera C1 and one luminance sensor 17A are provided below the display unit 12. In an embodiment, one camera C1 and one proximity sensor 17B are provided below the display unit 12. In an embodiment, the terminal device 10 have one camera C1, one luminance sensor 17A, and one proximity sensor 17B provided below the display unit 12.

Figure 10:
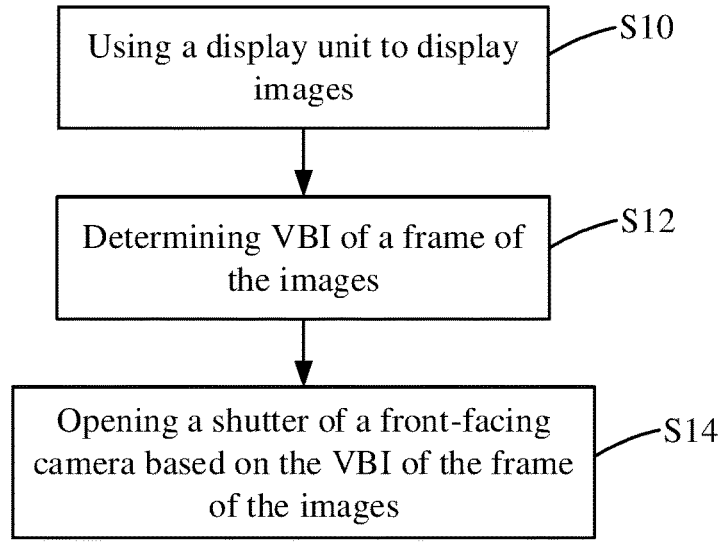
FIG. 10 is a flowchart of an image capturing method according to an embodiment of the present disclosure.

FIG. 10 is a flowchart of an image capturing method according to an embodiment of the present disclosure. Referring to FIG. 10 in accompanying above descriptions, the image capturing method is described in detail below.

As described above, the terminal device 10 includes the display unit 12 and the light sensing unit 17 (e.g., the front-facing camera C1). The display unit 12 has a display screen 12D exposed as an external surface of the terminal device 10 at a front side of the terminal device 10. The front-facing camera C1 is located below the display unit 12 and provided at a rear side of the display unit 12. The front-facing camera C1 is configured to sense incident light transmitted through the display screen 12D.

In block S10, the display unit 12 is used to display images. The images are shown on the display screen 12D. The display unit may be achieved by a self-illumination-type display unit such as an OLED display.

In block S12, a VBI of a frame of the images displayed by the display unit 12 is determined. In this block, the timing control unit 70 shown in FIG. 7 receives a timing of image displaying achieved by the display unit 12 and determines the VBI of the frame of the images based on the timing.

In block S14, the timing control unit 70 controls a shutter of the front-facing camera C1 to be opened for a predetermined period of time based on the VBI of the frame of the images displayed by the display unit. In this block, the front-facing camera C1 captures a scene in front of the terminal device 10 as a captured image. Referring to FIG. 8A, the time to open the shutter of the front-facing camera C1 is based on the VBI of the image frame displayed on the display screen 12D. During the VBI, there is almost no display content shown on the display screen 12D, that is, the display screen 12D is almost dark during this period. The shutter is opened during this period so as to prevent the luminance of displayed images on the display screen 12D from affecting the image capturing by the front-facing camera C1. In an embodiment, referring to FIG. 8B, the shutter of the front-facing camera C1 may be opened for more than one time at a predetermined time interval based on the VBIs of image frames displayed by the display unit 12 so as to get a still image by accumulating the captured content or obtain a video.

The front-facing camera C1 is integrated into the terminal device 10 without a need to occupy an area on the front surface of the terminal device 10. Accordingly, display screen-to-body ratio can be maximized and true full display is realized. Further, the image capturing method allows the front-facing camera C1 to capture one or more images while the display screen 12D is on. Accordingly, the user is not interrupted in viewing the content displayed on the display screen 12D when using the function of the front-facing camera C1, and thus video chatting is achievable using the image capturing method. Also, user viewing experience is improved.

Figure 11:
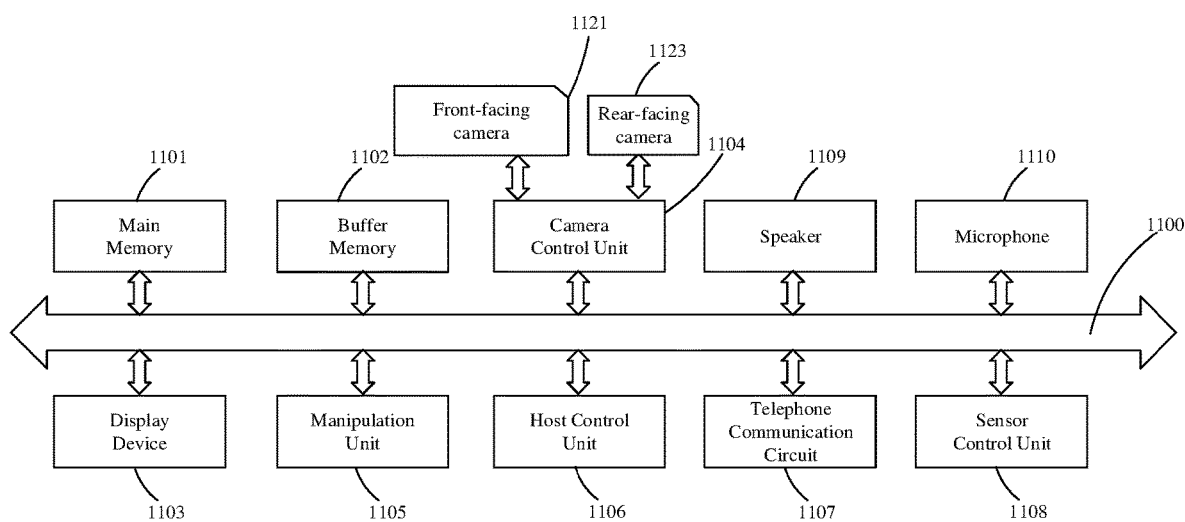
FIG. 11 is a block diagram illustrating a framework of a terminal device according to an embodiment of the present disclosure.

FIG. 11 is a block diagram illustrating a framework of the terminal device 10 according to an embodiment of the present disclosure. The terminal device 10 includes a main memory 1101, a buffer memory 1102, a display device 1103, a camera control unit 1104, a manipulation unit 1105, a host control unit 1106, a telephone communication circuit 1107, a sensor control unit 1108, a speaker 1109, a microphone 1110, and a bus 1100 connecting to the aforesaid components. The terminal device 10 further includes a front-facing camera 1121 and a rear-facing camera 1123 that are connected to the camera control unit 1104.

A microcomputer of the host control unit 1106 stores a software program for controlling various processes of the terminal device. The host control unit 1106 executes various control processes based on such a software program. The main memory 1101 stores, for example, data such as phone book data or mail addresses, or a uniform resource locator (URL). In addition, the main memory 112 may store the image data captured using the front-facing camera 1121, the second front-facing camera 1122, and the rear-facing camera 1123. The buffer memory 1102 is used as a work area when the host control unit 1106 executes the processes based on the software program.

The telephone communication circuit 1107 is a radio communication unit for executing telephone communication or other information communication (including communication via the Internet) via a base station and a mobile phone network. Under control of the host control unit 1106, call voice from a counterpart, received by the telephone communication circuit 1107, is emitted from the speaker 1109, and transmitted voice received by the microphone 1110 is transmitted to the counterpart through the telephone communication circuit 1107. The telephone communication circuit 1107 may also transmit/receive the image data captured by the cameras 1121, 1122, 1123 in the case of video chatting or video phone calls.

The display device 1103 displays various images under control of the host control unit 1106 and simultaneously displays the image of the counterpart transmitted from the counterpart in the case of the video chatting or the video phone calls. The manipulation unit 1105 includes functional buttons such as a power button and a volume up/down button. The host control unit 1106 is configured to detect what kind of key is pressed using the manipulation unit 1105 and execute the control process operation corresponding to the manipulated key. The sensor control unit 1108 controls a plurality of sensors such as a touch sensor, a GPS sensor, and a gyroscope sensor.

In addition, the front-facing camera 1121 and the rear-facing camera 1123 are connected to the camera control unit 1104. When a camera capture function, a video chatting function, or a video phone function is activated, the captured image data are received by the bus 1100 through the camera control unit 1104.

A person having ordinary skill in the art understands that each of the units, algorithm, and steps described and disclosed in the embodiments of the present disclosure are realized using electronic hardware or combinations of software for computers and electronic hardware. Whether the functions run in hardware or software depends on the condition of application and design requirement for a technical plan. A person having ordinary skill in the art can use different ways to realize the function for each specific application while such realizations should not go beyond the scope of the present disclosure.

It is understood by a person having ordinary skill in the art that he/she can refer to the working processes of the system, device, and unit in the above-mentioned embodiment since the working processes of the above-mentioned system, device, and unit are basically the same. For easy description and simplicity, these working processes will not be detailed.

It is understood that the disclosed system, device, and method in the embodiments of the present disclosure can be realized with other ways. The above-mentioned embodiments are examples only. The division of the units is merely based on logical functions while other divisions exist in realization. It is possible that a plurality of units or components are combined or integrated in another system. It is also possible that some characteristics are omitted or skipped. On the other hand, the displayed or discussed mutual coupling, direct coupling, or communicative coupling operate through some ports, devices, or units whether indirectly or communicatively by ways of electrical, mechanical, or other kinds of forms.

The units as separating components for explanation are or are not physically separated. The units for display are or are not physical units, that is, located in one place or distributed on a plurality of network units. Some or all of the units are used according to the purposes of the embodiments.

Moreover, each of the functional units in each of the embodiments can be integrated in one processing unit, physically independent, or integrated in one processing unit with two or more than two units.

If the software function unit is realized and used and sold as a product, it can be stored in a readable storage medium in a computer. Based on this understanding, the technical plan proposed by the present disclosure can be essentially or partially realized as the form of a software product. Or, one part of the technical plan beneficial to the conventional technology can be realized as the form of a software product. The software product in the computer is stored in a storage medium, including a plurality of commands for a computational device (such as a personal computer, a server, or a network device) to run all or some of the steps disclosed by the embodiments of the present disclosure. The storage medium includes a USB disk, a mobile hard disk, a read-only memory (ROM), a random access memory (RAM), a floppy disk, or other kinds of media capable of storing program codes.

While the present disclosure has been described in connection with what is considered the most practical and preferred embodiments, it is understood that the present disclosure is not limited to the disclosed embodiments but is intended to cover various arrangements made without departing from the scope of the broadest interpretation of the appended claims.

What is claimed is:

1. A terminal device, comprising:
a display unit having a display screen, the display unit configured to display images on the display screen; and
a light sensing unit located below the display unit and configured to sense incident light transmitted through the display screen;
wherein the display unit comprises a display panel and the display panel comprises:
a first electrode which is a transparent electrode;
a second electrode which is an opaque electrode; and
an organic layer sandwiched between the first electrode and the second electrode, wherein the organic layer spontaneously emits light when a voltage difference is applied between the first electrode and the second electrode, and
wherein the second electrode has a semi-transparent area disposed corresponding to the light sensing unit and a remaining area which is an area of the second electrode except for the semi-transparent area.

2. The terminal device according to claim 1, wherein the semi-transparent area and the remaining area are distributed with metal particles, and concentration of the metal particles in the semi-transparent area is less than the concentration of the metal particles in the remaining area.

3. The terminal device according to claim 2, wherein a material of the metal particles distributed in the semi-transparent area is identical to the material of the metal particles distributed in the remaining area.

4. The terminal device according to claim 2, wherein a material of the metal particles distributed in the semi-transparent area is different from the material of the metal particles distributed in the remaining area.

5. The terminal device according to claim 1, wherein the remaining area is configured to totally reflect the incident light transmitted through the display screen, and the semi-transparent area is configured to partially reflect and partially transmit the light transmitted through the display screen.

6. The terminal device according to claim 1, wherein the semi-transparent area corresponds to a metal film, and transmittance and reflectance of the metal film are defined by a thickness of the metal film.

7. The terminal device according to claim 1, wherein an average voltage difference applied between the semi-transparent area and the first electrode is greater than the average voltage difference applied between the remaining area and the first electrode.

8. The terminal device according to claim 1, wherein the display unit further comprises a touch control electrode layer configured to detect touch operations and generate sensing signals correspondingly for determining a coordinate of at least one touched point or a gesture formed by the at least one touched point.

9. The terminal device according to claim 1, wherein the light sensing unit is located at a center of the display screen.

10. The terminal device according to claim 1, wherein the light sensing unit is carried by a front-facing camera.

11. The terminal device according to claim 10, wherein the front-facing camera is configured for face unlocking.

12. The terminal device according to claim 1, wherein the light sensing unit comprises a luminance color filter which comprises mono-color filter units.

13. A terminal device, comprising:
a display unit having a display screen and configured to display images on the display screen;
a light sensing unit located below the display unit and configured to sense incident light transmitted through the display screen; and
a timing control unit connecting to the display unit and the light sensing unit and configured to control a timing sequence in operating the light sensing unit and the display unit,
wherein the timing control unit is configured to control the light sensing unit to sense light intensity or capture at least one image while the display screen is turned off and control the display unit to resume displaying the images after the light sensing unit completes in light sensing or image capturing.

14. The terminal device according to claim 13, wherein the light sensing unit comprises a shutter, and the timing control unit is configured to control the shutter to be opened for a predetermined period of time based on a vertical blanking interval (VBI) of a frame of the images displayed by the display unit.

15. The terminal device according to claim 14, wherein an open duration of the shutter overlaps with the VBI of the frame of the images displayed by the display unit.

16. The terminal device according to claim 14, wherein the at least one image is more than one image and the timing control unit is configured to control the shutter to be opened for more than one time at a predetermined time interval based on the VBIs of the frames of the images displayed by the display unit.

17. The terminal device according to claim 14, wherein the timing control unit is configured to control the light sensing unit to sense light intensity or capture the at least one image while the display screen is turned on.

18. The terminal device according to claim 13, wherein the light sensing unit comprises a camera and at least one of a luminance sensor or a proximity sensor.

19. A terminal device, comprising:
a display unit having a display screen and configured to display images on the display screen;
a light sensing unit located below the display unit and configured to sense incident light transmitted through the display screen; and
a timing control unit connecting to the display unit and the light sensing unit and configured to control a timing sequence in operating the light sensing unit and the display unit,
wherein the light sensing unit comprises a shutter, and the timing control unit is configured to control the shutter to be opened for a predetermined period of time based on a vertical blanking interval (VBI) of a frame of the images displayed by the display unit.

* * * * *